United States Patent [19]

Mahabadi

[11] Patent Number: 4,812,679

[45] Date of Patent: Mar. 14, 1989

[54] POWER-ON RESET CIRCUIT

[75] Inventor: John K. Mahabadi, Tempe, Ariz.

[73] Assignee: Motorola, Inc., Schaumburg, Ill.

[21] Appl. No.: 118,074

[22] Filed: Nov. 9, 1987

[51] Int. Cl.$^4$ .............. H03K 17/22; H03K 17/20; H03K 17/687; H03K 5/153

[52] U.S. Cl. .............. 307/272.1; 307/594; 307/592; 307/296 R

[58] Field of Search .............. 307/592–594, 307/596, 597, 603, 605, 272.3, 296.5

[56] References Cited

U.S. PATENT DOCUMENTS 4,591,745  5/1986  Shen ........................... 307/592
4,633,107 12/1986  Norsworthy ............... 307/592 X
4,698,531 10/1987  Jones ........................... 307/592
4,717,840  1/1988  Ouyang et al. ............. 307/592 X Primary Examiner—Stanley D. Miller
Assistant Examiner—David R. Bertelson
Attorney, Agent, or Firm—William E. Koch

[57] ABSTRACT

A power-on reset circuit includes a trigger voltage generating circuit which, when activated, causes current from a current source to be steered so as to charge a capacitor. When the voltage on the capacitor reaches a predetermined value, a switchable output stage is switched so as to generate the desired power-on reset signal. The trigger voltage generating circuit is responsive to a threshold voltage which tracks the power supply voltage and which is generated by separate circuitry.

7 Claims, 1 Drawing Sheet

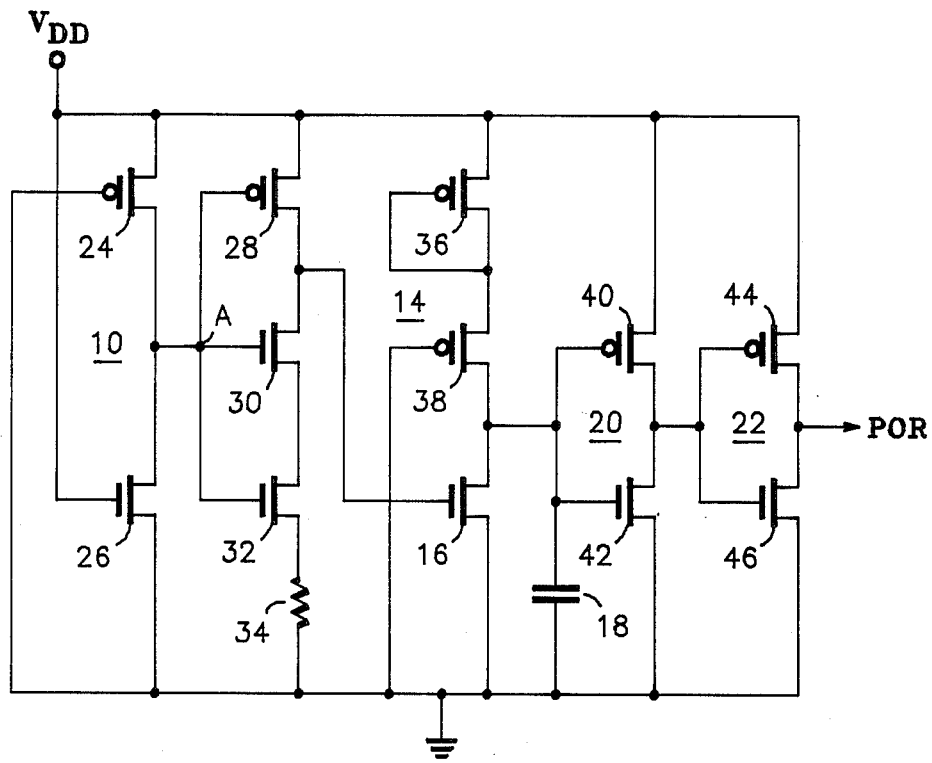
FIG. 1
FIG. 2
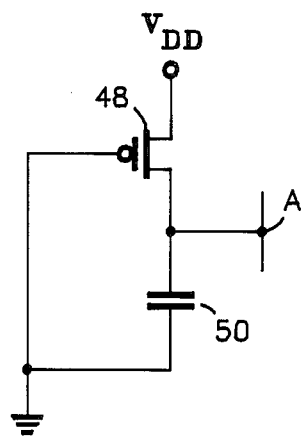

4,812,679

POWER-ON RESET CIRCUIT

BACKGROUND OF THE INVENTION

This invention relates generally to CMOS circuitry and, more particularly, to a low-power power-on-reset circuit suitable for implementation on an integrated circuit.

A power-on reset (POR) circuit, as that term is used herein, is a circuit which produces a momentary output signal upon initial application of power to the circuit or upon momentary interruptions of the power. Such circuits may be used, for example, for placing counters, registers, memories, or other circuits in a desired initial condition.

Selection of a power-on reset circuit for a particular application may involve one or more of the following criteria: static and dynamic response, operating voltage range, steady state power dissipation, and ease of implementation in integrated circuit form. The static and dynamic response should be such that the circuit operation is essentially independent of the supply voltage rise time. The operating voltage range should be such that the reset circuit does not require more voltage than the device with which it is to be used which otherwise would limit the operating range of the utilization device. The steady state power dissipation should be minimal and, ideally, zero. Finally, the circuit should not require a great deal of silicon area when implemented as an integrated circuit.

SUMMARY OF THE INVENTION

It is an object of the present invention to provide an improved power-on reset circuit.

It is a further object of the present invention to provide a monolithically integrable power-on circuit which consumes less power.

It is yet another object of the present invention to provide an improved power-on reset circuit which occupies less silicon area than prior art circuits.

According to a broad aspect of the invention there is provided a power on reset circuit for generating a reset signal when a first source of supply voltage is turned on, comprising a first node for coupling to said first source of supply voltage; a first means coupled to said first node for generating a threshold voltage when said first source of supply voltage is turned on; a current source; a switchable output stage for producing said reset signal; second means coupled to said first means for generating a trigger voltage in response to said threshold voltage; a first capacitor for coupling between said output stage and a second source of supply voltage and coupled to said current source; and steering means coupled to said second means and to said first capacitor and responsive to said trigger voltage for steering current to said first capacitor, said output stage generating said reset signal when the charge on said first capacitor reaches a predetermined value.

The above and other objects, features and advantages of the present invention will be more clearly understood from the following detailed description taken in conjunction with the accompanying drawings, in which:

BRIEF DESCRIPTION OF THE DRAWINGS

FIG. 1 is a circuit diagram of the inventive power-on reset circuit; and

FIG. 2 is a schematic diagram of an alternative to a portion of the circuit shown in FIG. 1.

DESCRIPTION OF THE PREFERRED EMBODIMENT

FIG. 1 is a schematic diagram of the invention power-on reset circuit. The circuit comprises a voltage generating stage 10, a threshold detecting stage 12, a current source 14, switching means shown as N-channel field effect transistor 16, delay means represented by capacitor 18, and first and second inverter sections 20 and 22 respectively.

The voltage generating stage comprises P-channel field effect transistor 24 having a gate coupled to ground and N-channel field effect transistor 26 having a gate coupled to a source of supply ($V_{DD}$). The drain of transistor 24 is coupled to $V_{DD}$, and the source of transistor 26 is coupled to ground. Both the source of transistor 24 and the drain of transistor 26 is coupled to node A.

Threshold detector section 12 includes P-channel field effect transistor 28, N-channel field effect transistors 30 and 32 respectively, and resistor 34. The gate electrodes of each of transistors 28, 30, 32 are each coupled to node A. The drain of transistor 28 is coupled to $V_{DD}$ while its source is coupled to the drain of transistor 30. The source of transistor 30 is coupled to the drain of transistor 32 while the source of transistor 32 is coupled, via resistor 34, to ground.

Current source 14 comprises P-channel field effect transistors 36 and 38 respectively. Transistor 36 is coupled as a diode; i.e. its gate is coupled to its source. The drain of transistor 36 is coupled to $V_{DD}$. Transistor 38 has a gate coupled to ground, a drain coupled to the source of transistor 36, and a source coupled to the drain of N-channel field effect transistor 16 which in turn has a source coupled to ground. The gate of transistor 16 is coupled to the source of transistor 28.

The first inverter stage 20 includes P-channel field effect transistor 40 and N-channel field effect transistor 42, each of which have gate electrodes coupled to the source of transistor 38 and to a first terminal of capacitor 18. The other terminal of capacitor 18 is coupled to ground. Transistor 40 has a drain coupled to $V_{DD}$ and a source coupled to the drain of transistor 42. The source of transistor 42 is coupled to ground.

The second inverter 22 comprises P-channel field effect transistor 44 and N-channel field effect transistor 46, each of which have gate electrodes coupled to the source of transistor 40. Transistor 44 has a drain coupled to $V_{DD}$ and a source coupled to the drain of transistor 46. The source of transistor 46 is coupled to ground. The power-on reset output signal (POR) is taken from the source of transistor 44.

As $V_{DD}$ rises (after power turn-on), both transistors 24 and 26 will turn on. That is, transistor 24 will turn on when the voltage between its gate and drain electrodes exceeds its threshold voltage. Similarly, transistor 26 will turn on when the voltage between its source and gate electrodes exceeds its threshold voltage. Thus, transistors 24 and 26 may be properly scaled such that the voltage produced at node A will track $V_{DD}$.

Initially, when the voltage at node A is low, transistor 28 will be on causing a high voltage to appear at the gate of transistor 16 turning it on. Thus, transistor 16 will sink the current being supplied through transistors 36 and 38. With no current available for charging capacitor 18, transistor 42 will remain off and transistor 40 will remain on. Thus, a high voltage will be applied to the gate electrode of transistors 44 and 46 turning transistor 46 on and transistor 44 off. Thus, the output signal (POR) will be low.

As the voltage at node A increases, transistor 28 will turn off. Furthermore, when the voltage at node A reaches a point equal to the voltage drop across resistor 34, the saturation voltage of transistor 32 and a threshold voltage of transistor 30, transistor 30 will turn on thus diverting current from the gate of transistor 16. The reduced voltage (trigger voltage) at the gate of transistor 16 will cause it to turn off. In this case, the current being supplied by current source 14 will now cause capacitor 18 to begin to charge. When the voltage across capacitor 18 exceeds the threshold voltage of transistor 42, transistor 42 will turn on. With transistor 42 on, a low voltage is supplied to the gate electrodes of transistors 44 and 46 causing transistor 44 to turn on and 46 to turn off. This will cause the power on reset signal (POR) to achieve a high state.

Several things should be noted. First, during power up, the voltage at node A must first exceed the IR drop across resistor 34, the saturation voltage of transistor 32 and the threshold voltage of transistor 30 before POR can go high. This high threshold substantially increases the circuit's noise immunity. Second, transistors 24 and 26 may be designed to provide minimum drain current during stand-by operation; i.e. as little as 25 microamps at five volts. Third, resistor 34 may be constructed within the same tub material as that used for transistors 30 and 32. Due to this and other design considerations, the inventive power-on reset circuit is significantly smaller than prior art circuits. Finally, the POR delay time is determined by transistors 36 and 38 and capacitor 18. During power down, capacitor 18 is discharged through transistor 16.

FIG. 2 illustrates an alternative voltage generating stage for use in conjunction with the remainder of the circuit shown in FIG. 1. That is, instead of coupling transistors 24 and 26 to node A as is shown in FIG. 1, node A is coupled to the source of a P-channel field effect transistor 48 which has a drain coupled to $V_{DD}$ and a source coupled to node A and to the first terminal of a capacitor 50. The second terminal of capacitor 50 is coupled to ground as is the gate electrode of transistor 48. Using this arrangement, the only current flowing in the circuit will be switching current during linear operation of the circuit or charging current during $V_{DD}$ rise and fall times for charging and discharging the capacitors. At all other times, only leakage current flows which is a function of the process by which the circuit was manufactured. Thus, there is virtually no current flow during stand-by operation resulting in a super low power circuit. Secondly, the resulting circuit occupies very little silicon area, even less than the one shown in FIG. 1.

The above description is given by way of example only. Changes in form and details may be made by one skilled in the art without departing from the scope of the invention as defined by the appended claims.

I claim:

1. A power on reset circuit for generating a reset signal when a first source of supply voltage is turned on, comprising:
   a first node coupled to said first source of supply voltage;
   a first means coupled to said first node for generating a threshold voltage when said first source of supply voltage is turned on;
   a current source;
   a switchable output stage for producing said reset signal;
   a first P-channel field effect transistor having a source, drain and gate, said drain coupled to said first source of supply voltage;
   a first N-channel field effect transistor having a drain coupled to the source of said first P-channel field effect transistor and having a source and gate;
   a second N-channel field effect transistor having a drain coupled to the source of said first N-channel field effect transistor and having a source, the gates of said first P-channel field effect transistor and said first and second N-channel field effect transistors coupled to said first means for receiving said threshold voltage;
   resistive means coupled between the source of said second N-channel field effect transistor and a second source of supply voltage, a trigger voltage being generated at the source of said first P-channel field effect transistor;
   a first capacitor coupled between said output stage and said second source of supply voltage and coupled to said current source; and
   steering means coupled to the source of said first P-channel field effect transistor and to said first capacitor and responsive to said trigger voltage for steering current to said first capacitor, said output stage generating said reset signal when the charge on said first capacitor reaches a predetermined value.

2. A circuit according to claim 1 wherein said first means comprises:
   a second P-channel field effect transistor having a drain coupled to said first source of supply voltage, a gate coupled to said second source of supply voltage and having a source at which said threshold voltage is generated; and
   a third N-channel field effect transistor having a drain coupled to the source of said second P-channel field effect transistor, a gate coupled to said first source of supply voltage, and a source coupled to said second source of supply voltage.

3. A circuit according to claim 1 wherein said first means comprises:
   a second P-channel field effect transistor having a drain coupled to said first source of supply voltage, a gate coupled to said second source of supply voltage, and having a source at which said threshold voltage is generated; and
   a second capacitor coupled between the source of said second P-channel field effect transistor and said second source of supply voltage.

4. A circuit according to claim 3 wherein said current source comprises:
   a third P-channel field effect transistor having a drain coupled to said first source of supply voltage and having a gate coupled to its source; and
   a fourth P-channel field effect transistor having a drain coupled to the source of said third P-channel field effect transistor, a gate coupled to said second source of supply voltage, and a source coupled to said steering means, said output stage, and said first capacitor.

5. A circuit according to claim 4 wherein said steering means comprises a fourth N-channel field effect transistor having a drain coupled to the source of said fourth P-channel field effect transistor, a gate coupled to the source of said first P-channel field effect transistor, and a source coupled to said second source of supply voltage.

6. A circuit according to claim 5 wherein said switchable output stage includes a first inverter comprising:

a fifth P-channel field effect transistor having a drain coupled to said first node, a gate coupled to the source of said fourth P-channel field effect transistor and to said first capacitor, and having a source; and a fifth N-channel field effect transistor having a drain coupled to the source of said fifth P-channel field effect transistor, a gate coupled to the source of said fourth P-channel field effect transistor and to said first capacitor, and a source coupled to said second source of supply voltage.

7. A circuit according to claim 6 wherein said switchable output stage includes a second inverter comprising:

a sixth P-channel field effect transistor having a drain coupled to said first node, a gate coupled to the source of said fifth P-channel field effect tansistor and having a source at which said reset signal is generated; and a sixth N-channel field effect transistor having a drain coupled to the source of said sixth P-channel field effect transistor, a gate coupled to the source of said fifth P-channel field effect transistor, and a source coupled to said second source of supply voltage.

* * * * *